(12) United States Patent
Hayashi

(10) Patent No.: US 10,896,998 B2
(45) Date of Patent: Jan. 19, 2021

(54) METHOD OF MANUFACTURING LIGHT EMITTING DEVICE

(71) Applicant: NICHIA CORPORATION, Anan (JP)

(72) Inventor: Tadao Hayashi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/733,989

(22) Filed: Jan. 3, 2020

(65) Prior Publication Data

US 2020/0144461 A1 May 7, 2020

Related U.S. Application Data

(62) Division of application No. 15/783,514, filed on Oct. 13, 2017, now Pat. No. 10,559,724.

(30) Foreign Application Priority Data

Oct. 19, 2016 (JP) ................................. 2016-205208

(51) Int. Cl.
*H01L 33/50* (2010.01)
*H01L 33/54* (2010.01)
(Continued)

(52) U.S. Cl.
CPC .......... *H01L 33/504* (2013.01); *H01L 33/486* (2013.01); *H01L 33/54* (2013.01);
(Continued)

(58) Field of Classification Search
None
See application file for complete search history.

(56) References Cited

U.S. PATENT DOCUMENTS

| 2004/0116033 A1 | 6/2004 | Ouderkirk et al. |
| 2011/0062471 A1 | 3/2011 | Bierhuizen et al. |

(Continued)

FOREIGN PATENT DOCUMENTS

| JP | 10-151794 A | 6/1998 |
| JP | 2001-111119 A | 4/2001 |

(Continued)

OTHER PUBLICATIONS

Non Final Office Action of the U.S. Appl. No. 15/783,514, dated Jan. 18, 2019.

(Continued)

*Primary Examiner* — Khaja Ahmad
(74) *Attorney, Agent, or Firm* — Global IP Counselors, LLP

(57) ABSTRACT

A method of manufacturing a light emitting device includes: providing a light emitting element including a light extraction surface, an electrode-formed surface on a side opposite to the light extraction surface, lateral surfaces positioned between the light extraction surface and the electrode-formed surface, and a pair of electrodes on the electrode-formed surface; providing a covering member including a lens portion and a first recess on a side different from the lens portion; disposing the light emitting element on a bottom surface of the first recess, with the light extraction surface and the bottom surface of the first recess facing each other; and forming a reflective member in the first recess to cover the lateral surfaces of the light emitting element while at least a part of the pair of electrodes is exposed from the reflective member.

22 Claims, 16 Drawing Sheets

(51) Int. Cl.
*H01L 33/48* (2010.01)
*H01L 33/60* (2010.01)
*H01L 33/64* (2010.01)
*H01L 33/62* (2010.01)

(52) U.S. Cl.
CPC ............ *H01L 33/60* (2013.01); *H01L 33/505* (2013.01); *H01L 33/62* (2013.01); *H01L 33/647* (2013.01); *H01L 2933/0033* (2013.01); *H01L 2933/0058* (2013.01); *H01L 2933/0066* (2013.01)

(56) References Cited

U.S. PATENT DOCUMENTS

| | | | |
|---|---|---|---|
| 2011/0102884 | A1 | 5/2011 | Narendran et al. |
| 2011/0121731 | A1 | 5/2011 | Tsutsumi et al. |
| 2011/0147778 | A1 | 6/2011 | Ichikawa |
| 2012/0223351 | A1 | 9/2012 | Margalit |
| 2013/0316478 | A1 | 11/2013 | Ichikawa |
| 2014/0226345 | A1* | 8/2014 | Song ............ H01L 33/62 362/382 |
| 2015/0036114 | A1 | 2/2015 | Schadt et al. |
| 2015/0069436 | A1 | 3/2015 | Akimoto et al. |
| 2015/0076529 | A1 | 3/2015 | Wang et al. |
| 2015/0124457 | A1 | 5/2015 | Sanga et al. |
| 2015/0263243 | A1 | 9/2015 | Nakagawa et al. |
| 2016/0005931 | A1 | 1/2016 | Lee et al. |
| 2016/0079483 | A1 | 3/2016 | Obata et al. |
| 2016/0201857 | A1* | 7/2016 | Lim ............ H01L 33/58 362/84 |
| 2016/0225965 | A1 | 8/2016 | Chien et al. |
| 2016/0240746 | A1* | 8/2016 | Yun ............ H01L 33/54 |
| 2016/0320689 | A1* | 11/2016 | Butterworth ............ H01L 33/58 |
| 2017/0084587 | A1* | 3/2017 | Hung ................ H01L 25/0753 |

FOREIGN PATENT DOCUMENTS

| | | |
|---|---|---|
| JP | 2010-528467 A | 8/2010 |
| JP | 2010-238846 A | 10/2010 |
| JP | 2011-129961 A | 6/2011 |
| JP | 2011108589 A | 6/2011 |
| JP | 2011-258657 A | 12/2011 |
| JP | 2011-258676 A | 12/2011 |
| JP | 2012-138454 A | 7/2012 |
| JP | 2013505572 A | 2/2013 |
| JP | 2014-090052 A | 5/2014 |
| JP | 2014521227 A | 8/2014 |
| JP | 2014-220475 A | 11/2014 |
| JP | 2015-012143 A | 1/2015 |
| JP | 2015-053361 A | 3/2015 |
| JP | 2015-056650 A | 3/2015 |
| JP | 2015-099940 A | 5/2015 |
| JP | 2015-111661 A | 6/2015 |
| JP | 2015-135986 A | 7/2015 |
| JP | 2015-176960 A | 10/2015 |
| JP | 2016-062940 A | 4/2016 |
| JP | 2016-086111 A | 5/2016 |
| JP | 2016-115729 A | 6/2016 |
| JP | 2016-518033 A | 6/2016 |
| JP | 2016-143881 A | 8/2016 |
| JP | 2017055093 A | 3/2017 |
| WO | 2008-146200 A1 | 12/2008 |
| WO | 2014-1847575 A1 | 11/2014 |

OTHER PUBLICATIONS

Final Office Action of the U.S. Appl. No. 15/783,514, dated May 28, 2019.

Advisory Action of the U.S. Appl. No. 15/783,514, dated Aug. 29, 2019.

Notice of Allowance of the U.S. Appl. No. 15/783,514, dated Oct. 9, 2019.

* cited by examiner

METHOD OF MANUFACTURING LIGHT EMITTING DEVICE

CROSS-REFERENCE TO RELATED APPLICATION

This application is a divisional application of U.S. patent application Ser. No. 15/783,514, filed on Oct. 13, 2017. This application claims priority to Japanese Patent Application No. 2016-205208, filed on Oct. 19, 2016. The entire disclosures of U.S. patent application Ser. No. 15/783,514 and Japanese Patent Application No. 2016-205208 are hereby incorporated herein by reference.

BACKGROUND

The present disclosure relates to a light emitting device and a method of manufacturing the same.

It is expected for lighting devices using semiconductor light emitting elements such as light emitting diodes (LED) to exhibit higher performance and higher reliability.

For example, Japanese Patent Publication No. H10-151794 A discloses a light emitting device, which attains high reliability by including: an LED chip disposed on a light-transmissive supporting body via a light-transmissive adhesive agent; and a conductive wire that electrically connects an electrode provided on a surface of the LED chip opposite to the surface being in contact with the light-transmissive adhesive agent and an external electrode provided at the light-transmissive supporting body.

SUMMARY

In the light emitting device disclosed in Japanese Patent Publication No. H10-151794 A, the electrode of the LED chip and the external electrode provided at the light-transmissive supporting body are connected to each other with the conductive wire, therefore, the heat dissipating path is long. Hence, there is a demand of a light emitting device that exhibits a good heat dissipation property.

One of objects of certain embodiments of the present disclosure is to provide a light emitting device that exhibits a good heat dissipation property and a method of manufacturing the same.

A method of manufacturing a light emitting device according to one embodiment includes: providing a light emitting element including a light extraction surface, an electrode-formed surface on a side opposite to the light extraction surface, lateral surfaces positioned between the light extraction surface and the electrode-formed surface, and a pair of electrodes on the electrode-formed surface; providing a covering member including a lens portion and a first recess on a side different from the lens portion; disposing the light emitting element on a bottom surface of the first recess, with the light extraction surface and the first recess facing each other; and forming a reflective member in the first recess to cover the lateral surfaces of the light emitting element while at least a part of the pair of electrodes is exposed from the reflective member.

A method of manufacturing a light emitting device according to one embodiment includes: providing a light emitting element including a light extraction surface, an electrode-formed surface on a side opposite to the light extraction surface, lateral surfaces positioned between the light extraction surface and the electrode-formed surface, and a pair of electrodes on the electrode-formed surface; providing a wavelength conversion member; providing a covering member including a lens portion and a first recess on a side different from the lens portion; disposing the wavelength conversion member on a bottom surface of the first recess, with the wavelength conversion member and the first recess facing each other; disposing the light emitting element on or above the wavelength conversion member; and forming a reflective member in the first recess to cover the lateral surfaces of the light emitting element while at least a part of the pair of electrodes is exposed from the reflective member.

Certain embodiments of the present disclosure provide a light emitting device that exhibits a good heat dissipation property and a method of manufacturing the same.

DETAILED DESCRIPTION OF EMBODIMENTS

In the following, with reference to the drawings as appropriate, a description will be given of embodiments of the present disclosure. Note that, a light emitting device and a method of manufacturing the same are described in the following for embodying the technical idea, and the description does not specify the present disclosure to the following unless otherwise specified. Further, a description in one embodiment holds true for other embodiment.

Further, in the following description, identical or similar members are denoted by identical name and reference sign, and a detailed description thereof will be omitted as appropriate. Further, as to the constituents of the present disclosure, a plurality of elements may be formed by an identical member so that the one member also serves as the plurality of elements. Conversely, the function of one member may be realized as being shared by a plurality of members.

First Embodiment

Figure 1A:
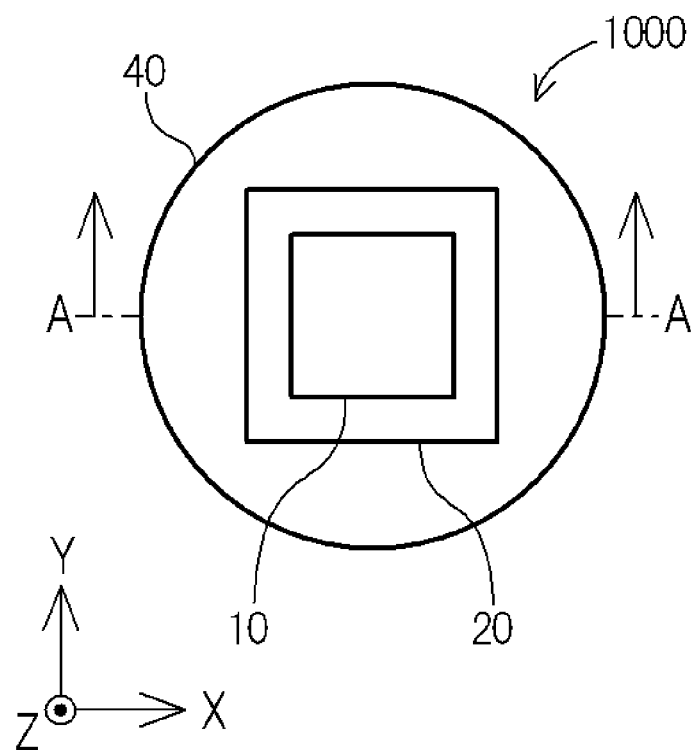
FIG. 1A is a top view showing the schematic structure of a light emitting device according to a first embodiment.
Figure 1B:
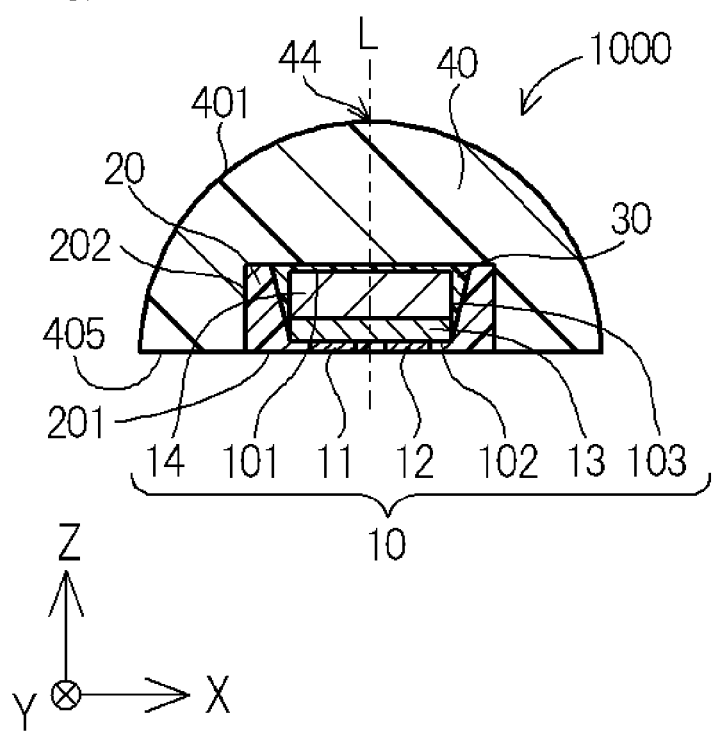
FIG. 1B is a section view taken along line A-A in FIG. 1A.

FIG. 1A is a top view showing the schematic structure of a light emitting device 1000 according to the first embodiment. FIG. 1B is a section view taken along line A-A in FIG. 1A. The light emitting device 1000 includes: a light emitting element 10, a reflective member 20, a covering member 40. The light emitting element 10 includes a light extraction surface 101, an electrode-formed surface 102 on the side opposite to the light extraction surface 101, lateral surfaces positioned 103 between the light extraction surface 101 and the electrode-formed surface 102, and a pair of electrodes 11, 12 on the electrode-formed surface 102. The pair of electrodes 11, 12 of the light emitting element 10 is exposed outside. The reflective member 20 is in contact with at least part of the light emitting element 10 to cover the lateral surfaces 103 of the light emitting element while exposing the pair of electrodes 11, 12 The covering member 40 includes a lens portion 401 at its upper surface, and is in contact with the reflective member 20 to cover the light emitting element 10 and the reflective member 20. Further, the light emitting element 10 and the covering member 40 are joined to each other via a first light-transmissive member 30.

In the present embodiment, the pair of electrodes 11, 12 of the light emitting element 10 are exposed outside the light emitting device, thereby enabling the heat dissipating path to be shortened. Thus, heat generated at the light emitting element is efficiently dissipated to a mounting board on which the light emitting element is mounted. Accordingly, the light emitting device according to the present embodiment exhibits a better heat dissipation property as compared to a device including a heat dissipating path which also serves as an external electrode provided at a supporting body on which a light emitting element is mounted.

Light Emitting Element 10

The light emitting element may be a known semiconductor light emitting element, such as the one configured with a nitride semiconductor or the like. The light emission wavelength of the light emitting element can be selected from the ultraviolet region to the infrared region including the visible region (i.e., 380 nm to 780 nm). Examples of a light emitting element having a peak wavelength of 430 nm to 490 nm include a nitride semiconductor. The nitride semiconductor may be $In_XAl_YGa_{1-X-Y}N$ ($0 \leq X$, $0 \leq Y$, $X+Y \leq 1$) or the like. The light emitting element 10 includes a light-transmissive substrate 14, a semiconductor layered body 13, and the pair of electrodes 11, 12.

Further, the light emitting element 10 includes the light extraction surface 101, the electrode-formed surface 102 on the side opposite to the light extraction surface 101, and the lateral surface 103 between the light extraction surface 101 and the electrode-formed surface 102. The light emitting element 10 includes the pair of electrodes 11, 12 in the electrode-formed surface 102. A shape of the pair of electrodes 11, 12 may be appropriately selected. In the present embodiment, the light extraction surface 101 can be referred to as the upper surface of the light-transmissive substrate 14, and the electrode-formed surface 102 can be referred to as the lower surface of the semiconductor layered body 13.

Reflective Member 20

The reflective member reflects light from the light emitting element. Covering the lateral surface of the light emitting element, the reflective member reflects light emitted in the lateral direction (i.e., X direction or Y direction) from the light emitting element, so that the light changes its traveling direction and travels upward from the light emitting element (i.e., Z direction). Thus, the ratio of the light traveling upward from the light emitting element can be increased with respect to the light emitted from the light emitting element, whereby the light extraction efficiency of the light emitting device improves.

The reflective member is in contact with at least part of the light emitting element. The reflective member may be in contact with the pair of electrodes of the light emitting element, or with the electrode-formed surface of the light emitting element. The reflective member may be in contact with the lateral surface of the light emitting element. The reflective member being in contact with at least part of the light emitting element allows the light emitted from the light emitting element to be increasingly reflected at the reflective member, as compared to the case where the reflective member is spaced apart from the light emitting element. The reflective member 20 being in contact with the electrode-formed surface 102 reduces a probability of light leaking downward from the light emitting element, whereby the light extraction efficiency of the light emitting device improves.

The reflective member may be configured with a light-reflective resin. The light-reflective resin refers to resin that exhibits high reflectivity to light from the light emitting element, e.g., a reflectivity of 70% or higher. The light-reflective resin may be, for example, a light-transmissive resin in which a light-reflective substance is dispersed. The light-reflective substance may be, for example, titanium oxide, aluminum oxide, zirconium oxide, magnesium oxide or the like. The light-reflective substance may be granular, fibrous, flaky or the like. The resin material contained in the light-reflective resin is preferably thermosetting light-transmissive resin such as silicone resin, silicone modified resin, epoxy resin, phenolic resin or the like. In particular, silicone resin is suitable due to its light resistance and heat resistance.

First Light-Transmissive Member 30

First light-transmissive member is a material for joining the light emitting element 10 and the covering member 40 to each other. When the light emitting device includes a wavelength conversion member to be described later, the first light-transmissive member joins the light emitting element 10 and the wavelength conversion member to each other. By virtue of the provision of the first light-transmissive member, the light emitting element 10 and the covering member 40 are easily joined to each other. The first light-transmissive member 30 may be located on merely a position between the light extraction surface 101 of the light emitting element 10 and the covering member 40 in order to join the light emitting element 10 and the covering member 40 to each other. Alternatively, the first light-transmissive member 30 may cover the light extraction surface 101 of the light emitting element 10 and the lateral surfaces 103 of the light emitting element 10, in order to join the light emitting element 10 and the covering member 40 to each other. It is preferable that the first light-transmissive member 30 covers the light extraction surface 101 of the light emitting element 10 and the lateral surfaces 103 of the light emitting element 10, because it improves adhesion between the light emitting element 10 and the covering member 40. The first light-transmissive member 30 has a light transmissivity higher than that of the reflective member 20 with respect to light emitted from the light emitting element 10. Therefore, the first light-transmissive member 30 preferably covers the light-transmissive substrate 14 and the lateral surfaces of the semiconductor layered body 13. In this manner, light emitted from the lateral surfaces of the light emitting element 10 is readily extracted to the outside of the light emitting device via the first light-transmissive member 30, whereby the light extraction efficiency improves.

The first light-transmissive member 30 may be configured with a light-transmissive resin. Preferably, the material of the first light-transmissive member 30 may be, in particular, a thermosetting light-transmissive resin such as silicone resin, silicone modified resin, epoxy resin, or phenolic resin. The first light-transmissive member is in contact with the light emitting element, and hence, it is susceptible to heat that is generated by the light emitting element in the lit state. The thermosetting resin is suitable for the first light-transmissive member 30 due to its good heat resistance. Further, the light emitting device exhibiting a good heat dissipation property can reduce a probability of deterioration of the first light-transmissive member 30 attributed to heat. Thus, a highly reliable light emitting device can be obtained.

Covering Member 40

The covering member 40 covers the light emitting element 10 and the reflective member 20. By virtue of the provision of the covering member, the light emitting element 10 and the reflective member 20 can be protected from the external environment, and light output from the light emitting element 10 can be optically controlled. The covering member 40 includes a lens portion 401 that optically controls light output from the light emitting element 10. The lens portion of the covering member may have a known lens shape, such as a convex lens, a concave lens, or a Fresnel lens. The covering member 40 may be formed in such a manner as to cover the light emitting element and the reflective member, by a known method such as compression molding or injection molding. Further, as in a method of manufacturing a light emitting device to be described later, the covering member defining a recess may be formed separately from the light emitting element and the reflective member. By the light emitting element and the reflective member being disposed in the recess in the formed covering member, the covering member can cover the light emitting element and the reflective member.

For example, when the lens portion of the covering member is shaped as a convex lens, preferably an uppermost portion 44 of the lens portion 401 and the center of the light emitting element 10 substantially correspond to each other as seen in a plan view. In the present specification, the term "substantially corresponding to each other" includes a tolerance of about ±50 µm. In this manner, the light from the center of the light emitting element, which is generally most intensive as compared to light from other portions of the light emitting element, is readily controlled by the lens portion.

The light emitting device according to the present embodiment exhibits a good heat dissipation property, and hence is capable of reducing heat applied to the covering member. This alleviates expansion of the covering member due to heat, and hence reduces variability in the light distribution property of the light emitting device due to heat. Further, the light emitting device exhibiting a good heat dissipation property reduces a probability of deterioration of the covering member, and the like, attributed to heat. Thus, a highly reliable light emitting device can be obtained.

Figure 1C:
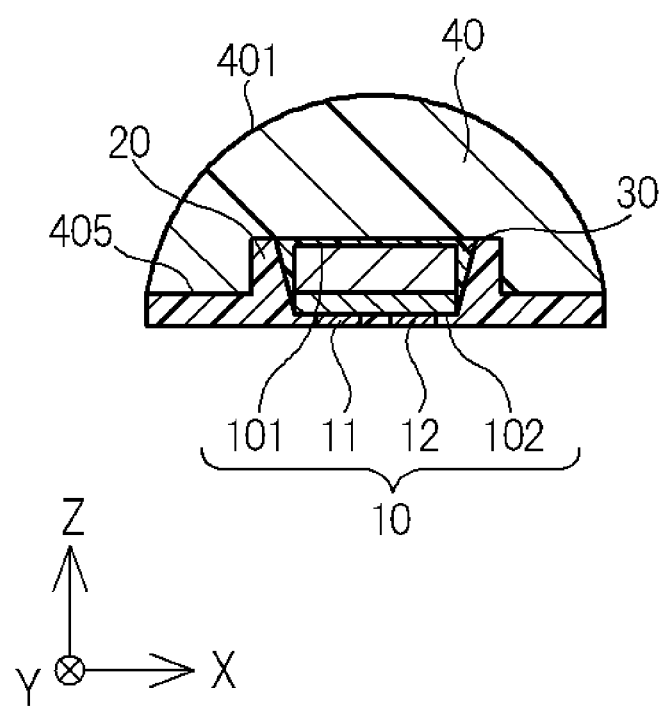
FIG. 1C is a schematic section view of a variation of the light emitting device according to the first embodiment.

In the covering member 40, part of a lower surface 405 on the side opposite to the lens portion 401 is preferably substantially flush with a lower surface 201 of the reflective member 20. In this manner, the covering member 40 can cover the entire lateral surface 202 of the reflective member 20, thereby improving adhesion between the covering member 40 and the reflective member 20. In the present specification, the term "being substantially flush with each other" includes a tolerance of about ±20 µm. Further, as shown in FIG. 1C, part of the lower surface 405 on the side opposite to the lens portion 401 of the covering member 40 may be covered with the reflective member 20. In such a case also, the contact area between the covering member 40 and the reflective member 20 is increased, thereby improving adhesion between the covering member 40 and the reflective member 20.

The covering member 40 may contain a wavelength conversion material that absorbs light from the light emitting element and re-emits light having a different wavelength from the light emitted from the light emitting element. The covering member 40 may contain a diffusing agent for diffusing light from the light emitting element. The covering member 40 functions to control distribution of light from the light source, therefore, the content of each of the wavelength conversion material, the diffusing material, and the coloring agent is preferably within the amount which does not interfere with the light distribution control of the covering member 40.

The covering member 40 may be configured with a light-transmissive material. The material of the covering member 40 may be a light-transmissive resin such as epoxy resin, silicone resin, a mixture thereof, or glass. Among these examples, silicone resin is preferable in consideration of light resistance and moldability.

Second Embodiment

Figure 2A:
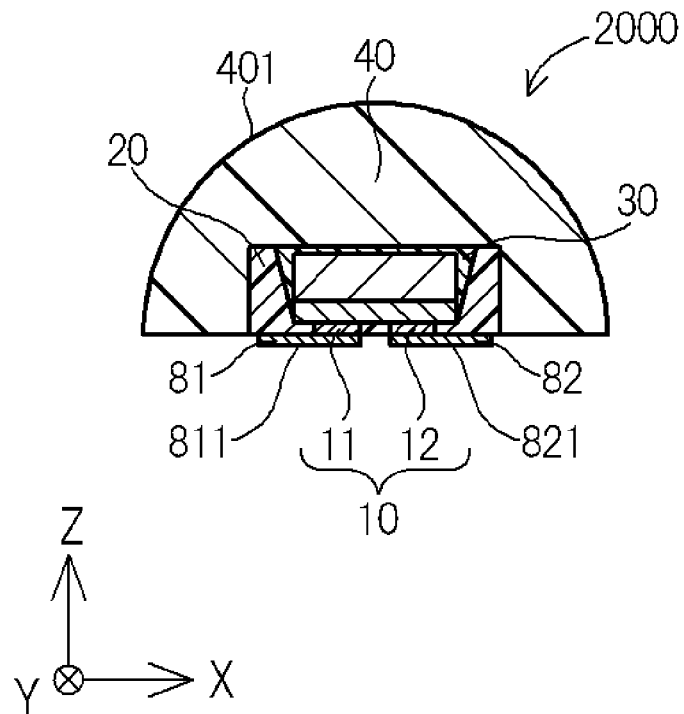
FIG. 2A is a schematic section view of a light emitting device according to a second embodiment.

FIG. 2A is a schematic section view of a light emitting device 2000 according to a second embodiment. The light emitting device 2000 according to the present embodiment is different from the light emitting device 1000 according to the first embodiment in including conductive members 81, 82 electrically connected to a pair of electrodes 11, 12 of the light emitting element 10 which respectively include the lower surfaces 811, 821 exposed outside the light emitting device and are electrically connected to a pair of electrodes 11, 12. The rest of the structure is the same as or similar to that of the light emitting device 1000 according to the first embodiment.

In the light emitting device 2000, the lower surfaces 811, 821 of the conductive members 81, 82, which are electrically connected to the pair of electrodes 11, 12 of the light emitting element 10, are exposed outside the light emitting device, thereby allowing the heat dissipating path to be shortened. Thus, the light emitting device according to the present embodiment exhibits a good heat dissipation property as compared to a device including a conductive member that is exposed outside the light emitting device and is provided on/above a supporting body on which a light emitting element is mounted.

Conductive Members 81, 82

The conductive members 81, 82 are electrically connected to the pair of electrodes 11, 12 of the light emitting element 10, and function as the external connection terminals of the light emitting device. By virtue of the conductive members 81, 82 functioning as the external connection terminals, the shape of the external connection terminals can be increased in size independently of the pair of electrodes 11, 12 of the light emitting element 10. This improves heat dissipation property of the light emitting device. The conductive members 81, 82 may be configured with metal.

The lower surfaces 811, 821 of the conductive members 81, 82 refer to the surfaces opposite to the surfaces opposing to the pair of electrodes 11, 12 of the light emitting element 10. By virtue of the lower surfaces 811, 821 of the conductive members 81, 82 being exposed outside, even though the light emitting device includes the conductive members 81, 82, the thickness of the light emitting device is increased only by the thickness of the conductive members 81, 82. Accordingly, a height of the light emitting device can be reduced. The thickness of the conductive members 81, 82 is preferably 1 µm or smaller, for example.

Figure 2B:
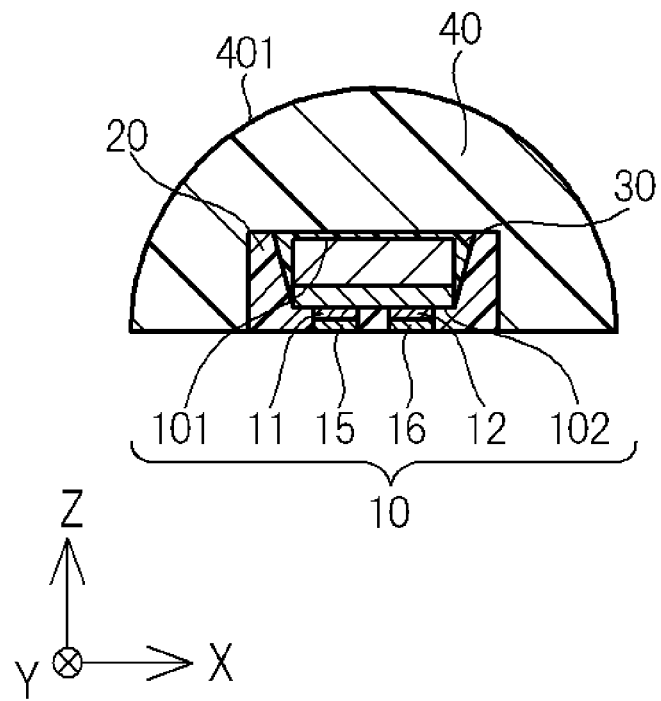
FIG. 2B is a schematic section view of a variation of the light emitting device according to the second embodiment.

As shown in FIG. 2B, the light emitting element 10 may include post electrodes 15, 16 which are respectively in contact with and electrically connected to the pair of electrodes 11, 12, and have a thickness of in a range of 50 µm to 150 µm. When the light emitting device is mounted on a mounting board or the like and the mounting board expands or contracts due to heat, the post electrodes can reduce stress applied to the joined part between the light emitting element and the mounting board. This contributes to preventing or discouraging the light emitting element from being detached from the mounting board. Further, the post electrodes 15, 16 also function as heat dissipating paths for dissipating heat generated by the light emitting element 10. The shape of the post electrodes 15, 16 as seen in a plan view may be any of various shapes formed by combinations of a straight line and/or a curved line. Further, the post electrodes 15, 16 preferably have substantially similar shape in the thickness direction. With the shape of the post electrodes 15, 16, the heat emitted by the light emitting element 10 can be evenly dissipated toward the mounting board from the post electrodes 15, 16. Examples of the shape of the post electrodes 15, 16 may be, a circular columnar shape, a rectangular parallelepiped, or a hexagonal columnar shape.

The material of the post electrodes 15, 16 of the light emitting element 10 may be copper, silver, gold, platinum or the like. In particular, copper is preferably employed as the material of the post electrodes 15, 16. Use of copper as the material of the post electrodes 15, 16 improves the heat dissipation property, as compared to the case where a material such as gold is employed.

The post electrodes 15, 16 may be printed bumps, stud bumps, or plated bumps which can be formed by electrolytic plating or electroless plating. Among these examples, plated bumps formed by electrolytic plating are preferable. For example, the post electrodes 15, 16 may be formed by a thickness in a range of from 50 µm to 150 µm by electrolytic copper plating.

When the light emitting element includes the post electrodes, the light emitting device may include conductive members that are electrically connected to the post electrodes of the light emitting element.

Third Embodiment

Figure 3A:
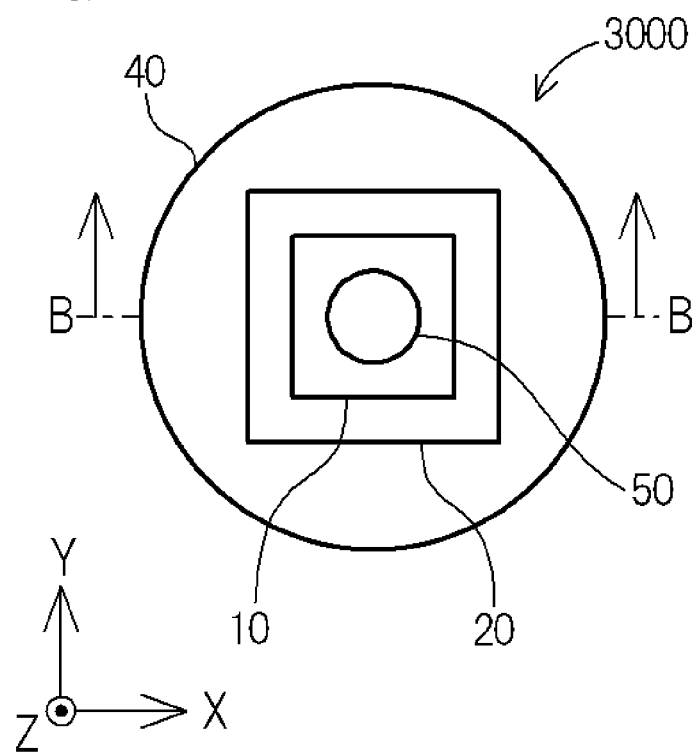
FIG. 3A is a top view showing the schematic structure of a light emitting device according to a third embodiment.
Figure 3B:
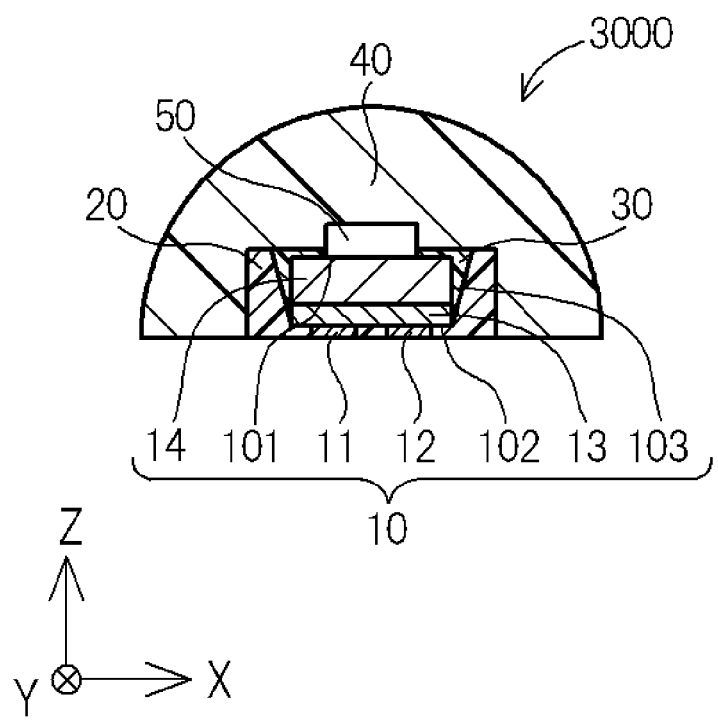
FIG. 3B is a section view taken along line B-B in FIG. 3A.

FIG. 3A is a top view showing the schematic structure of a light emitting device 3000 according to a third embodiment. FIG. 3B is a cross-section view taken along line B-B in FIG. 3A. The light emitting device 3000 according to the present embodiment is different from the light emitting device 1000 according to the first embodiment in including a gas portion 50 between the light extraction surface 101 of the light emitting element 10 and the covering member 40. The rest of the structure is the same as or similar to that of the light emitting device 1000 according to the first embodiment.

The gas portion 50 reflects light from the light emitting element at the interface between the covering member 40 and the gas portion 50, and the interface between the light extraction surface 101 of the light emitting element 10 and the gas portion 50. Provision of the gas portion 50 facilitates light distribution control of the light emitting device. The gas portion contains gas such as air or oxygen gas, or inert gas such as nitrogen gas or argon gas. The gas portion may be formed by a gas mixture of air, oxygen gas, and inert gas such as nitrogen gas or argon gas. The gas portion is preferably formed by: providing a covering member that includes a second recess at a bottom surface of a first recess; filling the second recess with gas such as air; and thereafter mounting the light emitting element in such a manner as to close an opening of the second recess. For ease of manufacture, the gas portion is preferably configured with air.

The gas portion is positioned on the light extraction surface of the light emitting element. In this manner, light from the light emitting element can be easily controlled with the gas portion. The shape of the gas portion is the shape of the space between the covering member and the light emitting element, and defined by the shape of the covering member and that of the light emitting element and others being in contact with the gas portion. For example, the upper surface of the gas portion is defined by the surface of the covering member being in contact with the gas portion. The lower surface of the gas portion is defined by the light extraction surface of the light emitting element being in contact with the gas portion. When a wavelength conversion member to be described later is provided, the lower surface of the gas portion is defined by the surface of the wavelength conversion member being in contact with the gas portion. The upper surface and the lower surface of the gas portion may each be a flat surface or a curved surface. The upper surface and the lower surface of the gas portion can be determined as appropriate in order to attain the desired light distribution of the light emitting device. The thickness of the gas portion is preferably smaller than the thickness of the light emitting element. Thus, the light emitting device having a reduced thickness can be obtained.

The single gas portion may be disposed on the light extraction surface of the light emitting element. Alternatively, the plurality of gas portions may be disposed on the light extraction surface of the light emitting element. The number of the gas portion can be determined as appropriate in order to attain the desired light distribution of the light emitting device.

The outer edge of the gas portion 50 as seen in a plan view may be formed substantially circular, may be formed to be substantially similar to the outer edge of the covering member as seen in a plan view, or alternatively, may be formed to be substantially similar to the outer edge of the light emitting element as seen in a plan view. The shape of the outer edge of the gas portion can be determined as appropriate in order to attain the desired light distribution of the light emitting device.

Preferably, the gas portion is positioned in such a manner as to overlap the center of the light emitting element as seen in a plan view. Thus, the gas portion is positioned on the optical axis of the light emitting element, thereby facilitating control of light distribution of the light emitting device.

In joining the light emitting element 10 and the covering member 40 via the first light-transmissive member 30, controlling the application amount and the application position of the first light-transmissive member 30 can prevent or discourage the first light-transmissive member 30 from entering the gas portion 50.

As seen in a plan view, the outer edge of the gas portion is preferably disposed on an inner side of the outer edge of the light emitting element 10. In this manner, the gas portion can be easily formed according to a method of manufacturing a light emitting device to be described later.

Due to the good heat dissipation property of the light emitting device according to the present embodiment, the covering member is less likely to expand. Consequently, the gas portion is also less likely to deform. Thus, the light distribution property of the light emitting device can be easily controlled.

Fourth Embodiment

Figure 4A:
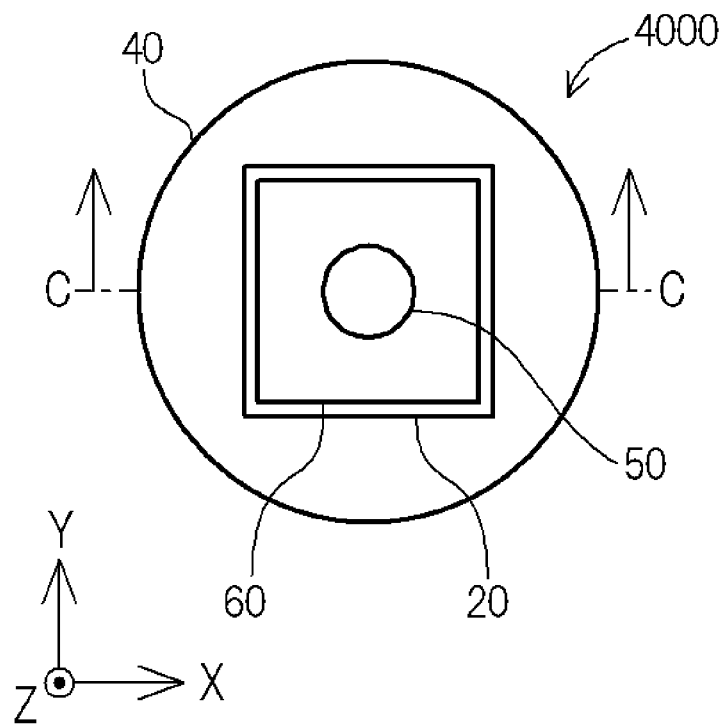
FIG. 4A is a top view showing the schematic structure of a light emitting device according to a fourth embodiment.
Figure 4B:
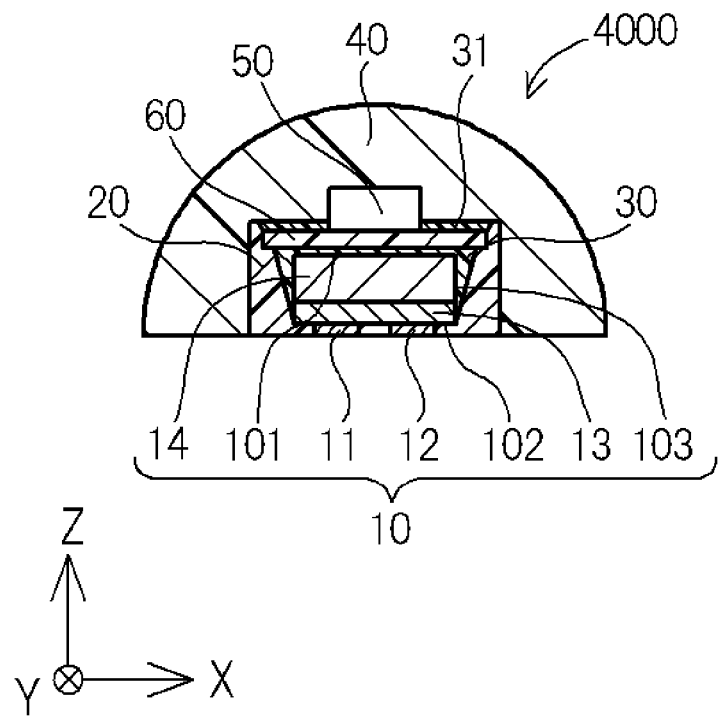
FIG. 4B is a section view taken along line C-C in FIG. 4A.

FIG. 4A is a top view showing the schematic structure of a light emitting device 4000 according to a fourth embodiment. FIG. 4B is a section view taken along line C-C in FIG. 4A. The light emitting device 4000 according to the present embodiment is different from the light emitting device 3000 according to the third embodiment in including a wavelength conversion member 60 on the light extraction surface 101. The rest of the structure is the same as or similar to that of the light emitting device 3000 according to the third embodiment.

Wavelength Conversion Member 60

The wavelength conversion member 60 converts light having a first peak wavelength emitted from the light emitting element into light having a second peak wavelength which is different from the first peak wavelength. With the wavelength conversion member 60 provided on the light extraction surface of the light emitting element 10, for example, the covering member can only need to contain a smaller amount or none of a wavelength conversion material. This facilitates light distribution control with the covering member having a curved surfaced lens portion on its upper surface. The wavelength conversion member 60 may include a light-transmissive portion and a light shielding portion to be described later.

The wavelength conversion member 60 may be configured with a light-transmissive material (e.g., resin or glass) containing a wavelength conversion substance. In particular, the material of the wavelength conversion member is preferably a resin material. The resin of the wavelength conversion member is preferably a thermosetting light-transmissive resin such as silicone resin, silicone modified resin, epoxy resin, or phenolic resin. In particular, silicone resin is suitable due to its light resistance and heat resistance.

The wavelength conversion substance may be particles of a fluorescent material that can be excited by light emitted from the light emitting element. Examples of fluorescent materials that can be excited by a blue-color light emitting element or an ultraviolet light emitting element include: a cerium-activated yttrium-aluminum-garnet-based fluorescent material (YAG:Ce); a cerium-activated lutetium-aluminum-garnet-based fluorescent material (LAG:Ce); a nitride-based fluorescent material such as a europium and/or chromium-activated nitrogen-containing calcium aluminosilicate-based fluorescent material ($CaO-Al_2O_3-SiO_2$:Eu, Cr), a europium-activated silicate-based fluorescent material (($Sr,Ba)_2SiO_4$:Eu), a β-SiAlON fluorescent material, a CASN-based fluorescent material, or a SCASN-based fluorescent material; a fluoride-based fluorescent material such as a KSF-based fluorescent material; a sulfide-based fluorescent material; a chloride-based fluorescent material; a silicate-based fluorescent material; a phosphate-based fluorescent material; a quantum dot fluorescent material; or the like. By combining one or more of these fluorescent materials with a blue light emitting element or an ultraviolet light emitting element, a light emitting device of various wavelengths can be manufactured.

As seen in a plan view, the outer edge of the gas portion is preferably disposed on an inner side of the outer edge of the wavelength conversion member. In this manner, the gas portion can be readily formed according to a method of manufacturing a light emitting device to be described later.

The wavelength conversion member 60 and the covering member 40 are joined to each other via a second light-transmissive member 31. The second light-transmissive member 31 may be configured with the same or similar material to that of the first light-transmissive member 30. The second light-transmissive member 31 is less likely to enter the gas portion 50 by controlling the application amount and the application position of the second light-transmissive member 31. When the wavelength conversion member 60 is provided, the light emitting element 10 and the wavelength conversion member 60 are joined to each other via the first light-transmissive member 30.

Fifth Embodiment

Figure 5A:
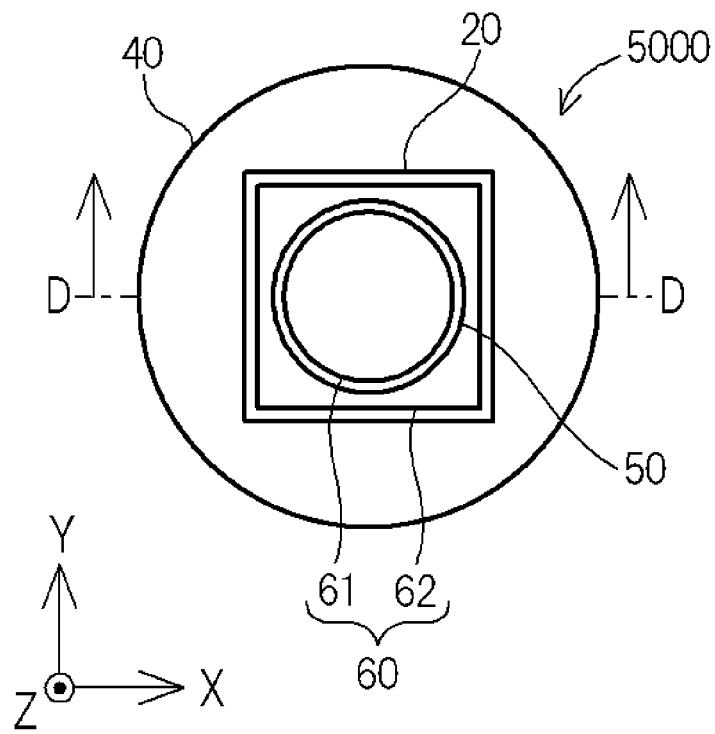
FIG. 5A is a top view showing the schematic structure of a light emitting device according to a fifth embodiment.
Figure 5B:
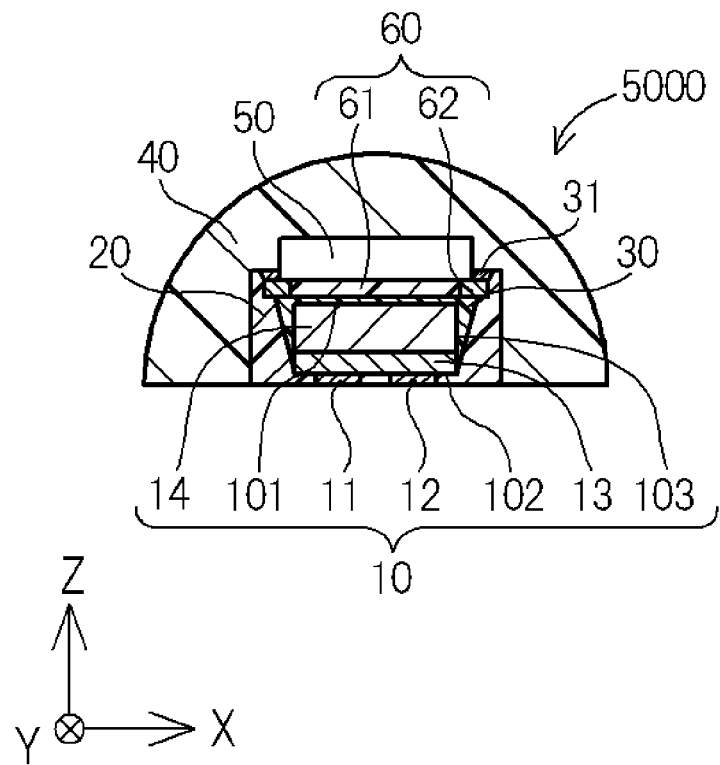
FIG. 5B is a section view taken along line D-D in FIG. 5A.

FIG. 5A is a top view showing the schematic structure of a light emitting device 5000 according to a fifth embodiment. FIG. 5B is a section view taken along line D-D in FIG. 5A. The light emitting device 5000 according to the present embodiment is different from the light emitting device 4000 according to the fourth embodiment in that the wavelength conversion member 60 includes a light-transmissive portion 61 and a light shielding portion 62 formed around the light-transmissive portion 61, and in size of the gas portion as seen in a plan view. The rest of the structure is the same as or similar to that of the light emitting device 4000 according to the fourth embodiment.

Light-Transmissive Portion 61

The light-transmissive portion 61 may be configured with a light-transmissive material (e.g., resin or glass) containing a wavelength conversion substance, and may be made of the material identical or similar to that of the wavelength conversion member.

Light Shielding Portion 62

The light shielding portion 62 is a member having a light transmissivity lower than that of the light-transmissive portion with respect to light from the light emitting element. By virtue of the wavelength conversion member 60 including the light-transmissive portion 61 and the light shielding portion 62 formed around the light-transmissive portion 61, even though the outer edge of the wavelength conversion member 60 is disposed on an outer side of the outer edge of the gas portion 50 as seen in a plan view, the outer edge of the gas portion 50 can be disposed on an outer side of the outer edge of the light-transmissive portion 61 as seen in a plan view. The wavelength conversion member 60 can have an outer edge disposed outwardly of that of the gas portion as seen in a plan view, thereby enabling facilitation of forming the gas portion in a method of manufacturing a light emitting device to be described later.

With the wavelength conversion member 60 including the light-transmissive portion 61 and the light shielding portion 62, light emitted from the light emitting element can be mostly output from the light-transmissive portion 61. The gas portion 50 can have the outer edge disposed outwardly of that of the light-transmissive portion 61 as seen in a plan view, the entire surface of the light-transmissive portion from which light of the light emitting element is mostly emitted is covered with the gas portion. This facilitates light distribution control of the light emitting device.

Sixth Embodiment

Figure 6A:
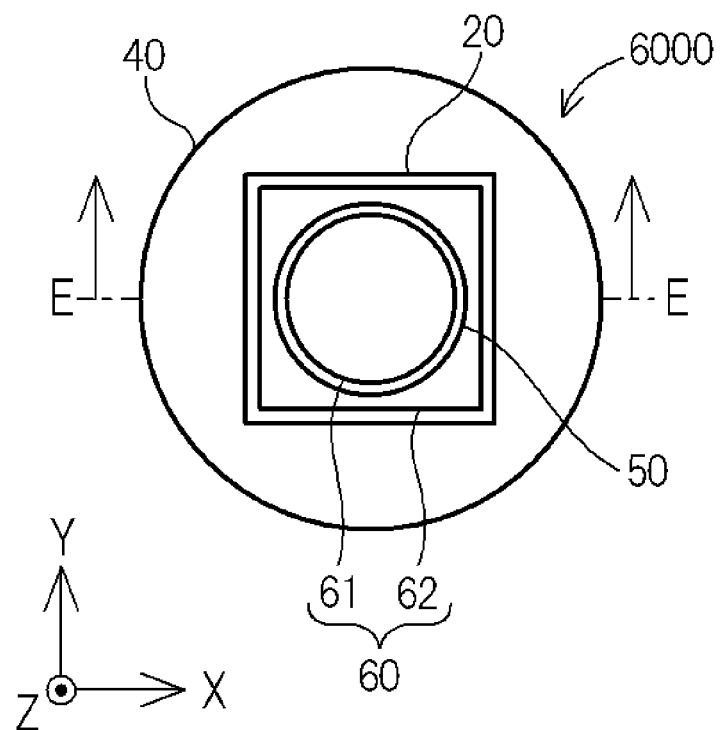
FIG. 6A is a top view showing the schematic structure of a light emitting device according to a sixth embodiment.
Figure 6B:
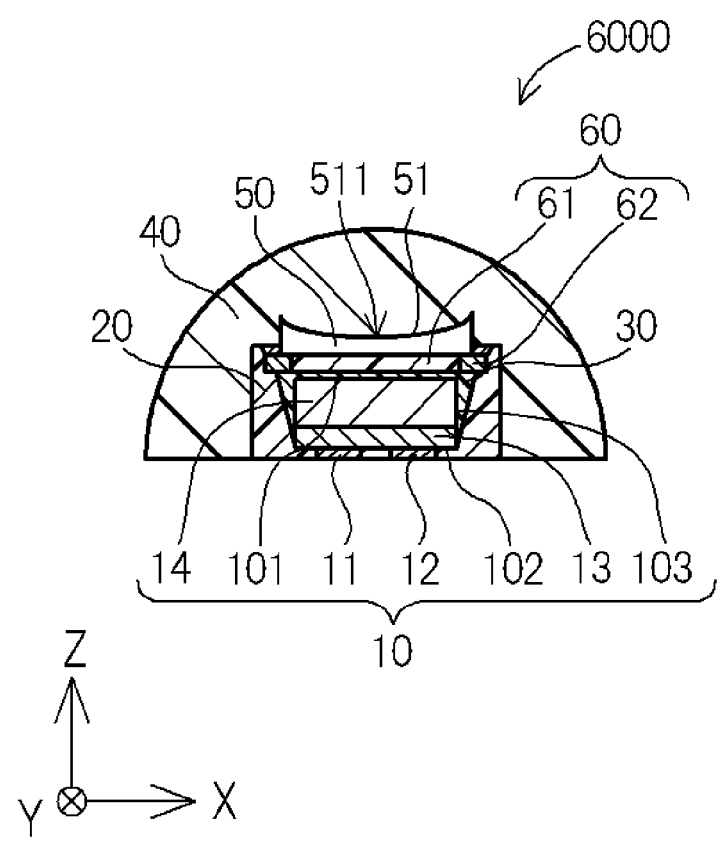
FIG. 6B is a section view taken along line E-E in FIG. 6A.

FIG. 6A is a top view showing the schematic structure of a light emitting device 6000 according to a sixth embodiment. FIG. 6B is a section view taken along line E-E in FIG. 6A. The light emitting device 6000 according to the present embodiment is different from the light emitting device 5000 according to the fifth embodiment in the shape of the gas portion 50. The rest of the structure is the same or similar to that of the light emitting device 5000 according to the fifth embodiment.

The gas portion 50 of the light emitting device 6000 according to the sixth embodiment includes a concave 51 at its upper surface. In other words, the covering member 40 includes a curved surfaced protrusion on the surface facing the light extraction surface 101 of the light emitting element 10. As seen in a plan view, a lowermost portion 511 of the concave 51 at the upper surface of the gas portion 50 substantially corresponds to the center of the light emitting element. The gas portion 50 including the concave 51 allows light emitted from the light emitting element to be refracted at the interface between the concave 51 of the gas portion 50 and the covering member 40, so that the light emitted from the light emitting element can be condensed. Thus, a light emitting device with narrow light distribution can be obtained.

Seventh Embodiment

Figure 7A:
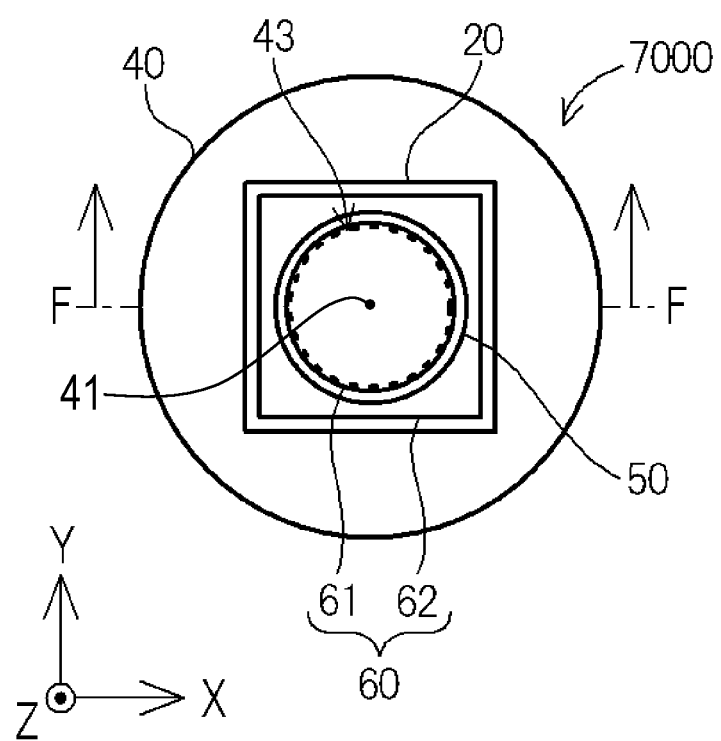
FIG. 7A is a top view showing the schematic structure of a light emitting device according to a seventh embodiment.
Figure 7B:
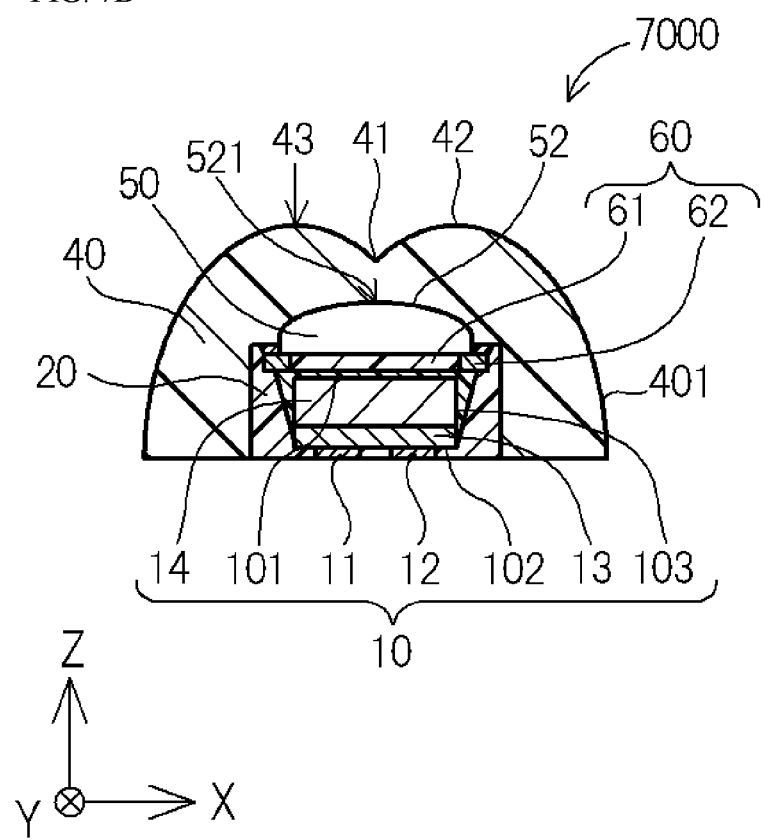
FIG. 7B is a section view taken along line F-F in FIG. 7A.

FIG. 7A is a top view showing the schematic structure of a light emitting device 7000 according to a seventh embodiment. FIG. 7B is a section view taken along line F-F in FIG. 7A. The light emitting device 7000 according to the present embodiment is different from the light emitting device 6000 according to the sixth embodiment in the shapes of the gas portion and the covering member. The rest of the structure is the same as or similar to that of the light emitting device 6000 according to the sixth embodiment.

The gas portion 50 of the light emitting device 7000 according to the seventh embodiment includes a curved surfaced protrusion 52 at its upper surface. In other words, the covering member 40 includes a concaved at the surface opposing to the light extraction surface 101 of the light emitting element. As seen in a plan view, an uppermost portion 521 of the protrusion 52 at the upper surface of the gas portion 50 substantially corresponds to the center of the light emitting element. The gas portion 50 including the protrusion 52 allows light emitted from the light emitting element to be refracted at the interface between the protrusion 52 of the gas portion 50 and the covering member 40, so that the light emitted from the light emitting element can spread. Thus, a light emitting device with wide light distribution can be obtained.

The covering member 40 of the light emitting device 7000 according to the seventh embodiment includes a depression 41 at the lens portion 401 of its upper surface, and includes a protrusion 42 on the outer side relative to the depression 41 in a plan view. As seen in a plan view, the lowermost portion of the depression 41 of the lens portion 401 substantially corresponds to the center of the light emitting element 10. Further, a ridge 43 being the uppermost portion of the protrusion 42 is formed to be substantially circular as seen in a plan view. The covering member 40 including the depression 41 allows light emitted from the light emitting element to be refracted at the interface between the depression 41 of the covering member 40 and outside the light emitting device, so that the light emitted from the light emitting element can spread. Thus, a light emitting device with wide light distribution can be obtained.

It is also possible to condense light emitted from the light emitting element with the recess 51 of the gas portion 50 as in the light emitting device 6000 according to the sixth embodiment, and thereafter to spread the light with the depression 41 of the covering member 40 as in the light emitting device 7000 according to the seventh embodiment. Such spreading the condensed light with the covering member facilitates light distribution control.

Eighth Embodiment

Figure 8A:
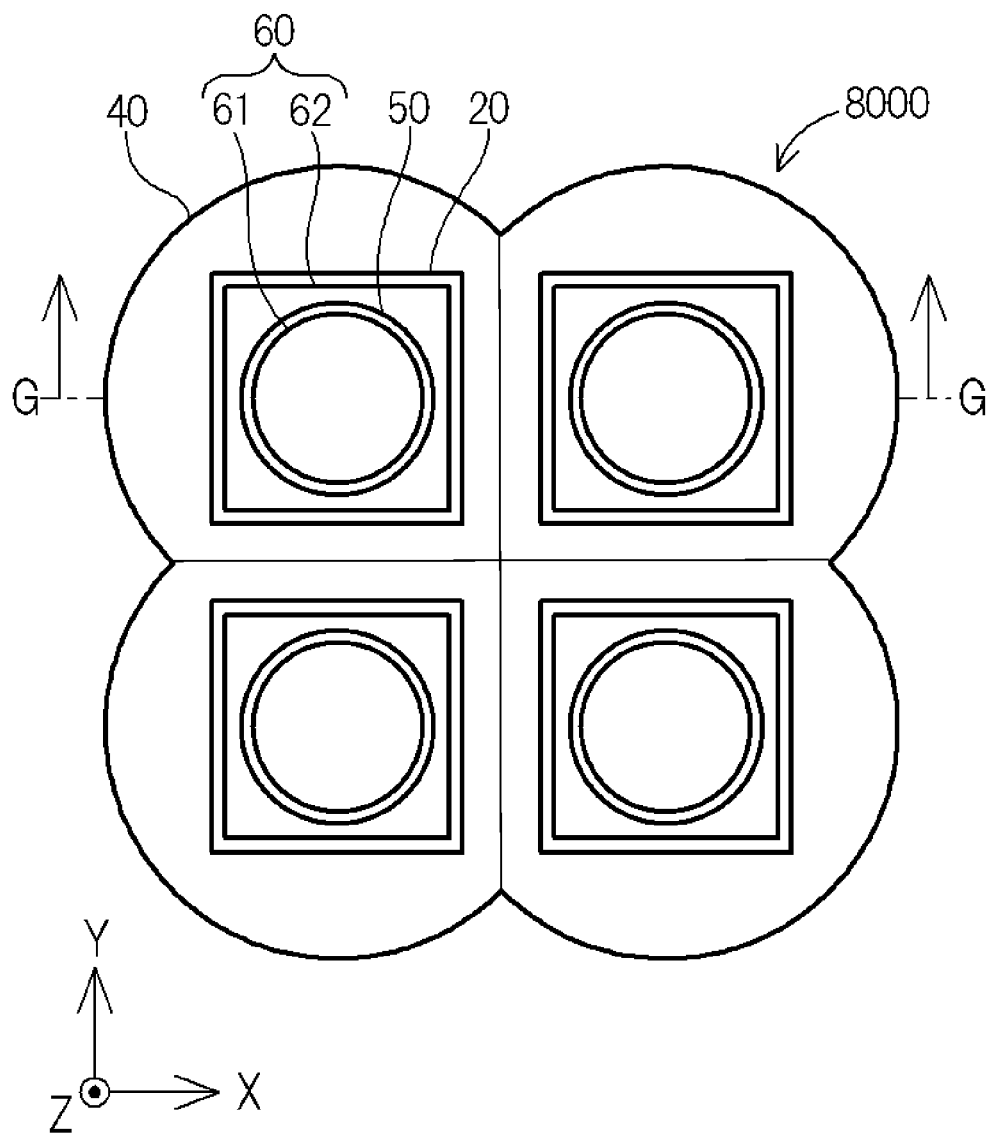
FIG. 8A is a top view showing the schematic structure of a light emitting device according to an eighth embodiment.
Figure 8B:
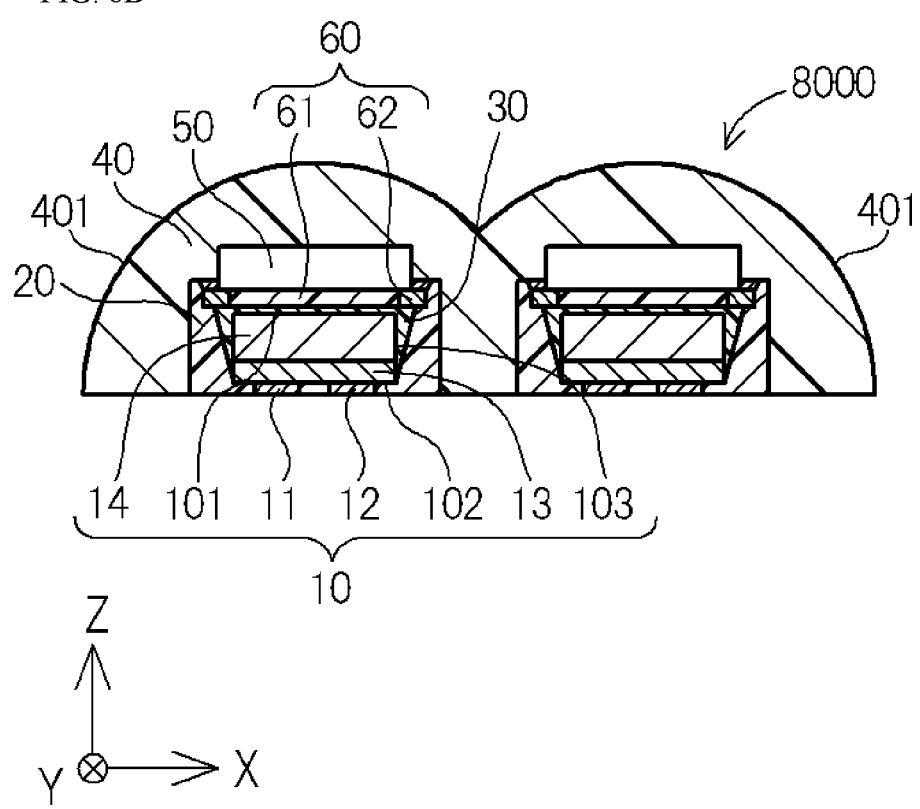
FIG. 8B is a section view taken along line G-G in FIG. 8A.

FIG. 8A is a top view showing the schematic structure of a light emitting device 8000 according to an eighth embodiment. FIG. 8B is a section view taken along line G-G in FIG. 8A. The light emitting device 8000 according to the present embodiment is different from the light emitting device 5000 according to the fifth embodiment in that the covering member 40 includes a plurality of lens portions 401, and that the plurality of lens portions 401 each have the structure of the light emitting device 5000 according to the fifth embodiment. In other words, the light emitting device 8000 according to the eighth embodiment is different from the light emitting device 5000 according to the fifth embodiment in that the covering members of a plurality of light emitting devices 5000 according to the fifth embodiment are continuous.

The covering member 40 of the light emitting device 8000 according to the eighth embodiment includes a plurality of lens portions 401. Further, the light emitting device 8000 according to the eighth embodiment includes light emitting elements 10 respectively corresponding to the plurality of lens portions 401. Thus, the light emission surface of the light emitting device 8000 according to the eighth embodiment can have the total area of the plurality of lens portions 401, thereby enabling increment of the light emission surface compared to the area of the lens portion serving as the light emission surface of the light emitting device 5000 according to the fifth embodiment. Thus, a light emitting device with a wide light emission surface can be obtained. Further, the light emitting device according to the present embodiment can realize shorter intervals between a plurality of light emitting elements compared to the intervals between a plurality of the light emitting devices 5000 according to the fifth embodiment.

Similarly to the second embodiment, the third to eighth embodiments may also include conductive members that are electrically connected to a pair of electrodes of the light emitting element, with their lower surfaces exposed outside.

Method of Manufacturing Light Emitting Device 2000

According to Second Embodiment

Figure 9A:
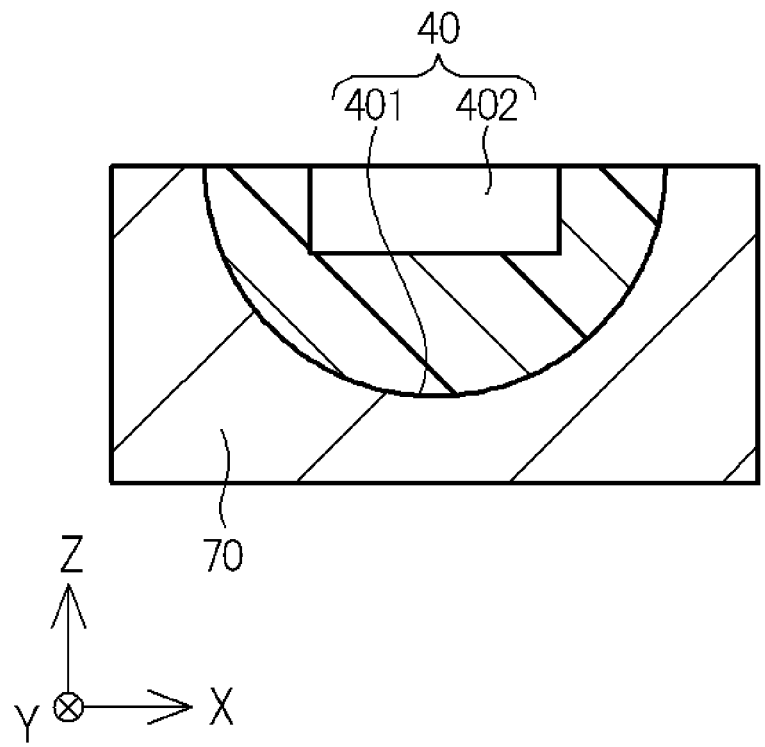
FIG. 9A is a schematic section view showing a method of manufacturing the light emitting device according to the second embodiment.
Figure 9B:
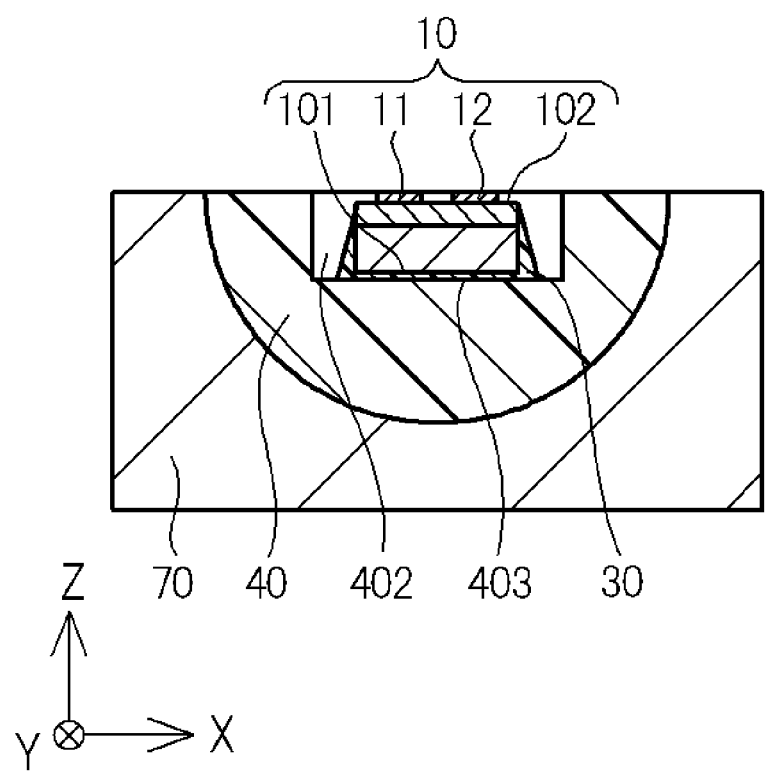
FIG. 9B is a schematic section view showing the method of manufacturing the light emitting device according to the second embodiment.
Figure 9C:
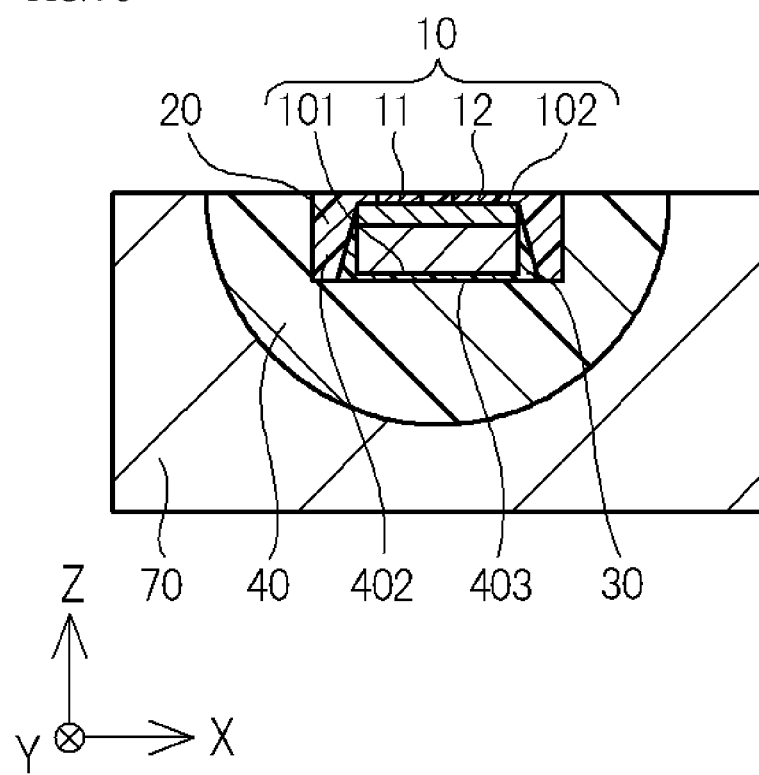
FIG. 9C is a schematic section view showing the method of manufacturing the light emitting device according to the second embodiment.

With reference to FIGS. 9A to 9C, a description will be given of a method of manufacturing the light emitting device 2000 according to the second embodiment.

Operation A-1: Providing Light Emitting Element

A light emitting element is provided, which includes a light extraction surface, an electrode-formed surface on the side opposite to the light extraction surface, a lateral surface positioned between the light extraction surface and the electrode-formed surface, and a pair of electrodes on the electrode-formed surface.

Operation A-2: Providing Covering Member

As shown in FIG. 9A, the covering member 40 that defines at least one lens portion 401, and the first recess 402 on the side opposite to the lens portion 401 is provided. The covering member 40 is fixed by being placed in a retaining member 70, or the like.

Operation A-3: Mounting Light Emitting Element

As shown in FIG. 9B, the light emitting element 10 is mounted on the bottom surface 403 of the first recess 402, having the light extraction surface 101 of the light emitting element 10 opposed to the first recess 402. The light emitting element 10 and the covering member 40 are joined to each other via the first light-transmissive member 30.

Mounting the light emitting element 10 on the covering member 40 reduces the probability of misalignment between the covering member 40 and the light emitting element 10 as compared to the case where the covering member is disposed on the light emitting element mounted on the mounting board. In the case where the covering member is disposed on the light emitting element mounted on the mounting board, in general, the covering member is mounted with reference to a mark placed on the mounting board. Accordingly, when the light emitting element is misaligned on the mounting board, misalignment occurs also between the light emitting element and the covering member. In the manufacturing method according to the present embodiment, the light emitting element is mounted on the covering member 40, therefore, the present embodiment is less susceptible to misalignment in mounting the light emitting element on the mounting board. Thus, the present embodiment can reduce a probability of misalignment between the covering member 40 and the light emitting element 10.

Further, when the reflective member covering the lateral surface of the light emitting element is provided, the outer edge of the light emitting element is less easily identified, thereby tending to occur consequently misalignment between the covering member and the light emitting element. However, in the manufacturing method according to the present embodiment described later, after the light emitting element is mounted on the covering member, the reflective member covering the lateral surface of the light emitting element is formed. Thus, the present embodiment reduces the probability of misalignment between the covering member and the light emitting element.

Operation A-4: Forming Reflective Member

As shown in FIG. 9C, the reflective member 20 is formed in the first recess, in such a manner as to cover the lateral surface of the light emitting element 10 while exposing a pair of electrodes 11, 12. The reflective member 20 also covers the first light-transmissive member 30. Further, in the electrode-formed surface 102 of the light emitting element 10, a portion that is not covered with the pair of electrodes 11, 12 may be covered with the reflective member 20. At this time, the thickness of the reflective member 20 (i.e., Z direction) may be adjusted such that part of the pair of electrodes 11, 12 is exposed outside the reflective member 20. Further, after the reflective member is formed by a sufficient thickness to embed the pair of electrodes, the reflective member may be removed in such a manner as to expose the pair of electrodes. The reflective member may be removed by a method known in the art. For example, the reflective member may be removed by etching, cutting, grinding, polishing, blasting or the like.

Operation A-5: Forming Conductive Members

The conductive members that are electrically connected to the pair of electrodes of the light emitting element may be formed by sputtering, vapor deposition, atomic layer deposition (ALD), metal organic chemical vapor deposition (MOCVD), plasma-enhanced chemical vapor deposition (plasma CVD, PECVD), atmospheric plasma deposition, or the like.

Through the operations described above, the light emitting device 2000 according to the second embodiment can be obtained. Further, by eliminating the operation of forming the conductive members, the light emitting device 1000 according to the first embodiment can be obtained.

Method of Manufacturing Light Emitting Device 3000 According to Third Embodiment With reference to FIGS. 10A and 10B, a description will be given of a method of manufacturing the light emitting device 3000 according to the third embodiment.

Operation B-1: Providing Light Emitting Element

Similarly to the method of manufacturing the light emitting device 2000 according to the second embodiment, the light emitting element is provided.

Operation B-2: Providing Covering Member

Figure 10A:
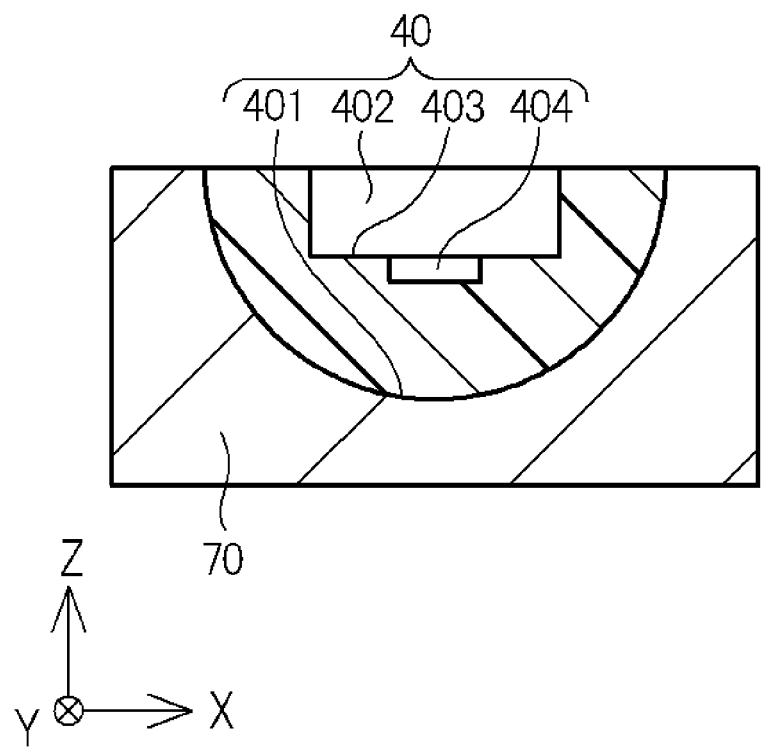
FIG. 10A is a schematic section view showing a method of manufacturing the light emitting device according to the third embodiment.

As shown in FIG. 10A, the covering member 40 is provided, which includes at least one lens portion 401, the first recess 402 on the side opposite to the lens portion 401, and the second recess 404 provided at the bottom surface 403 of the first recess 402 while having the outer edge disposed on an inner side of the outer edge of the light extraction surface of the light emitting element as seen in a plan view. The covering member 40 is fixed by being placed in a retaining member 70, or the like.

Operation B-3: Mounting Light Emitting Element

Figure 10B:
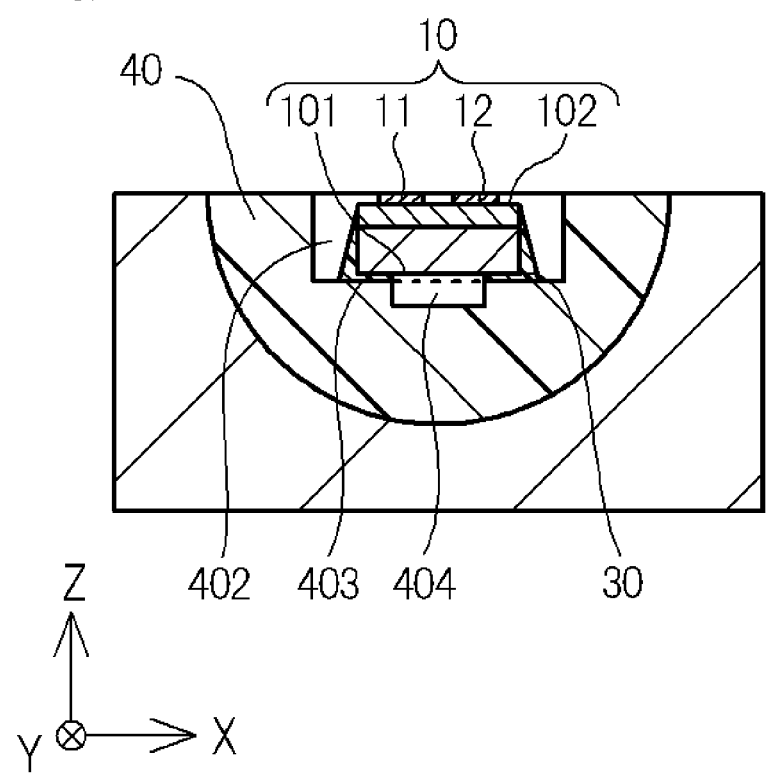
FIG. 10B is a schematic section view showing the method of manufacturing the light emitting device according to the third embodiment.

As shown in FIG. 10B, the light emitting element 10 is disposed on the bottom surface 403 of the first recess 402, having the light extraction surface 101 of the light emitting element 10 and the bottom surface 403 of the first recess 402 facing each other. The light emitting element 10 and the covering member 40 are joined to each other via the first light-transmissive member 30. In mounting the light emitting element 10, the second recess 404 is closed by the light emitting element 10 and/or the first light-transmissive member 30 such that the gas portion is formed in the second recess 404. By virtue of the second recess 404 having the outer edge disposed on an inner side of that of the light extraction surface 101 of the light emitting element 10 as seen in a plan view, the second recess can be easily closed. Before mounting the light emitting element, the second recess is filled with gas such as air or oxygen gas, or inert gas such as nitrogen gas or argon gas.

Operation B-4: Forming Reflective Member

Similarly to the method of manufacturing the light emitting device 2000 according to the second embodiment, the reflective member is formed. The opening of the second recess is closed by the light emitting element and/or the first light-transmissive member, thereby preventing or discouraging the reflective member from entering the second recess.

Through the operations described above, the light emitting device 3000 according to the third embodiment can be obtained. Similarly to the method of manufacturing the light emitting device 2000 according to the second embodiment, the operation of forming the conductive members may be included.

Method of Manufacturing Light Emitting Device 4000 According to Fourth Embodiment With reference to FIGS. 11A and 11B, a description will be given of a method of manufacturing the light emitting device 4000 according to the fourth embodiment.

Operation C-1: Providing Light Emitting Element

Similarly to the method of manufacturing the light emitting device 2000 according to the second embodiment, the light emitting element is provided.

Operation C-2: Providing Wavelength Conversion Member

The above-described wavelength conversion member is provided, which is configured with a light-transmissive resin or glass material containing a wavelength conversion substance. As described above, the wavelength conversion member may include the light-transmissive portion and the light shielding portion.

Operation C-3: Providing Covering Member

A covering member is provided, which includes at least one lens portion, a first recess on the side opposite to the lens portion, and a second recess provided at the bottom surface of the first recess while having the outer edge disposed on an inner side of the outer edge of the wavelength conversion member in the plan view. The covering member is fixed by being placed in a retaining member or the like.

Operation C-4: Mounting Wavelength Conversion Member

Figure 11A:
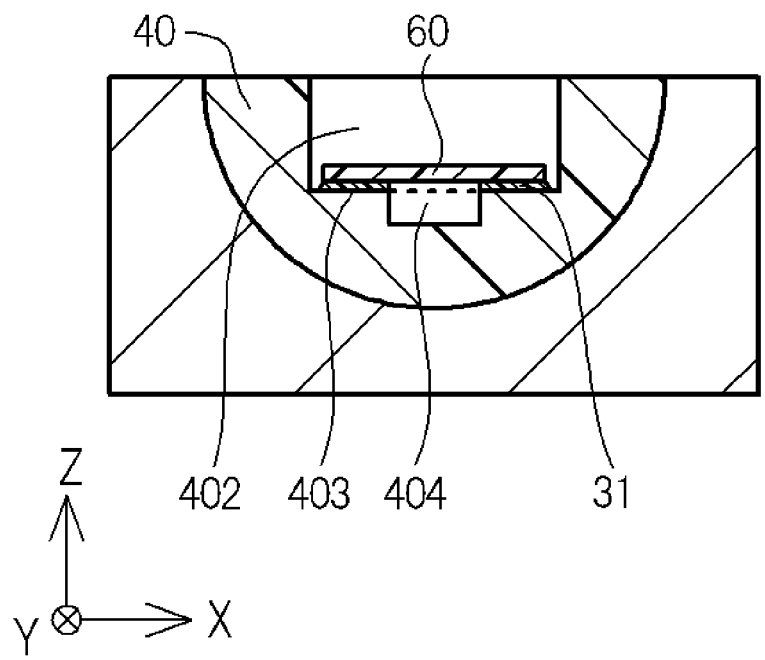
FIG. 11A is a schematic section view showing a method of manufacturing the light emitting device according to the fourth embodiment.

As shown in FIG. 11A, the wavelength conversion member 60 is disposed on the bottom surface 403 of the first recess 402, with the wavelength conversion member 60 and the first recess 402 facing each other. The wavelength conversion member 60 and the covering member 40 are joined to each other via the second light-transmissive member 31. The second light-transmissive member 31 can be prevented or discouraged from entering the second recess 404 by controlling the application amount and the application position of the second light-transmissive member 31. A B-staged sheet may be employed as the second light-transmissive member 31. This can also prevent or discourage the second light-transmissive member 31 from entering the second recess 404.

In mounting the wavelength conversion member 60, the second recess 404 is closed by the wavelength conversion member 60 and/or the second light-transmissive member 31 such that the gas portion is formed in the second recess 404. By virtue of the second recess 404 having the outer edge disposed on an inner side of that of the wavelength conversion member 60 as seen in a plan view, the second recess can be easily closed. Before mounting the wavelength conversion member, the second recess is filled with gas such as air or oxygen gas, or inert gas such as nitrogen gas or argon gas.

Operation C-5: Mounting Light Emitting Element

Figure 11B:
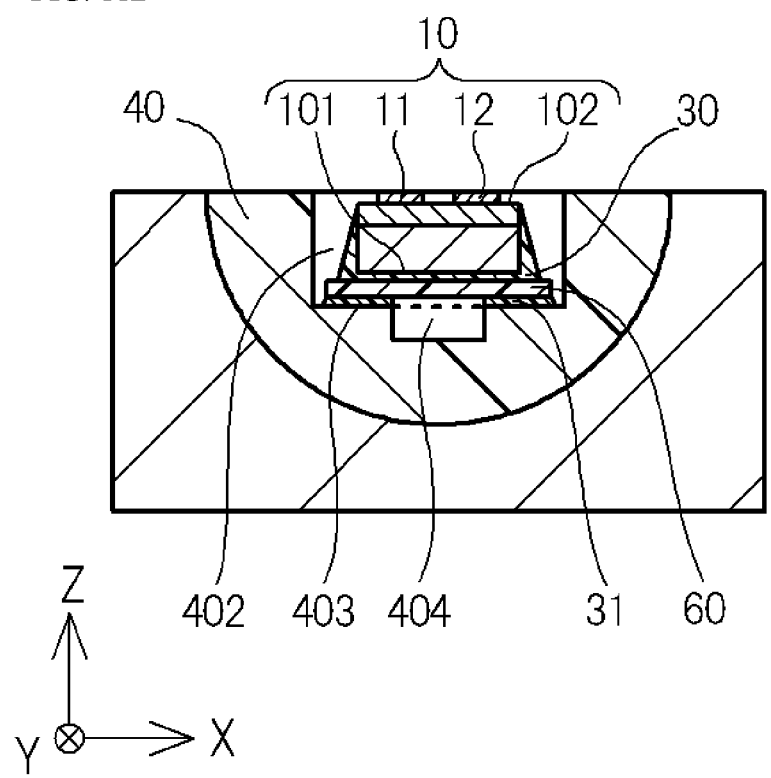
FIG. 11B is a schematic section view showing the method of manufacturing the light emitting device according to the fourth embodiment.

As shown in FIG. 11B, the light emitting element 10 is disposed on the wavelength conversion member 60. The light emitting element 10 and the wavelength conversion member 60 are joined to each other via the first light-transmissive member 30.

Operation C-6: Forming Reflective Member

Similarly to the method of manufacturing the light emitting device 2000 according to the second embodiment, the reflective member is formed. The opening of the second recess is closed by the light emitting element and/or the first light-transmissive member, therefore, the reflective member is less likely to enter the second recess.

Through the operations described above, the light emitting device 4000 according to the fourth embodiment can be obtained. Further, similarly to the method of manufacturing the light emitting device 2000 according to the second embodiment, the operation of forming the conductive members may be included.

Method of Manufacturing Light Emitting Device 8000

According to Eighth Embodiment

Figure 12A:
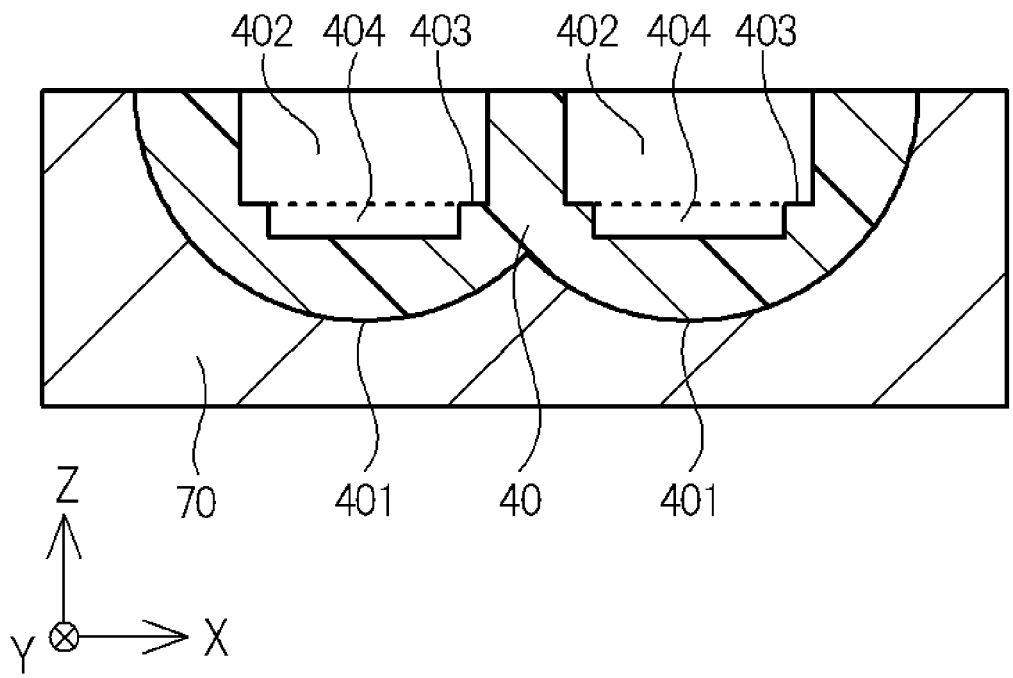
FIG. 12A is a schematic section view showing a method of manufacturing the light emitting device according to the eighth embodiment.
Figure 12B:
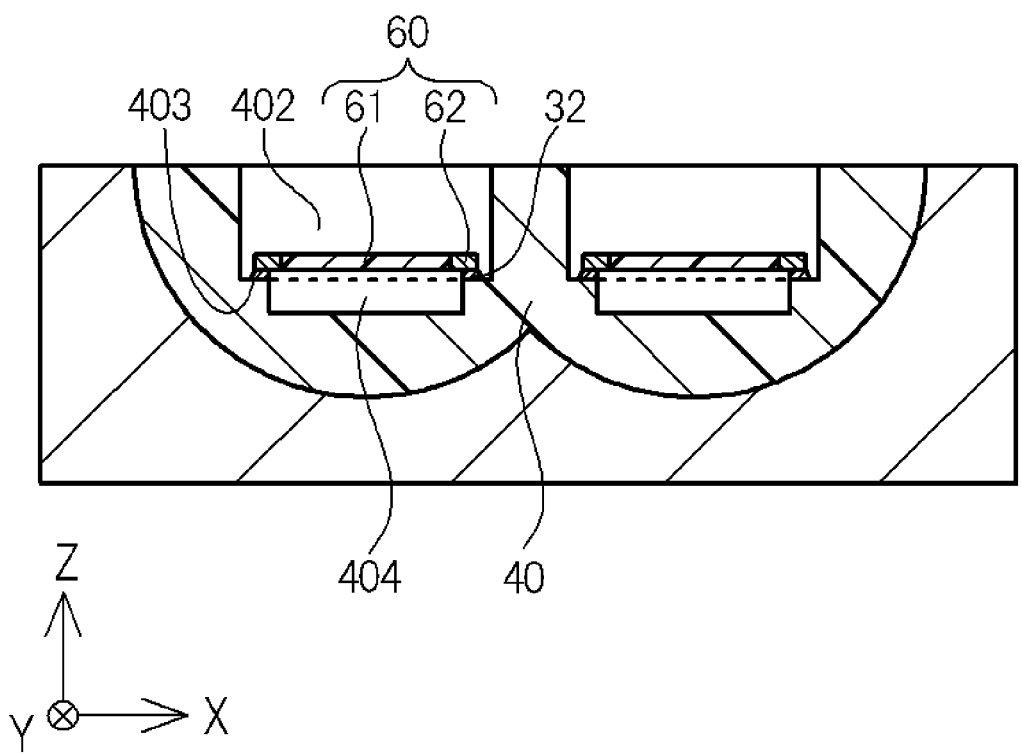
FIG. 12B is a schematic section view showing the method of manufacturing the light emitting device according to the eighth embodiment.

With reference to FIGS. 12A and 12B, a description will be given of a method of manufacturing the light emitting device 8000 according to the eighth embodiment.

Operation D-1: Providing Light Emitting Element

A plurality of light emitting elements is provided, each of which is the same as or similar to that in the method of manufacturing the light emitting device 2000 according to the second embodiment.

Operation D-2: Providing Wavelength Conversion Member

A plurality of wavelength conversion members is provided, each of which wavelength conversion members is the same as or similar to that in the method of manufacturing the light emitting device 4000 according to the fourth embodiment.

Operation D-3: Providing Covering Member

As shown in FIG. 12A, the covering member is provided, which includes a plurality of lens portions 401, the first recesses 402 on the side opposite to the lens portions 401, and the second recesses 404 respectively positioned at the bottom surfaces 403 of the first recesses. Each second recess 404 has the outer edge smaller than that of corresponding one of the wavelength conversion members 60 as seen in a plan view. The covering member 40 is fixed by being placed in a retaining member 70, or the like.

Operation D-4: Mounting Wavelength Conversion Member

As shown in FIG. 12B, the wavelength conversion members 60 are respectively disposed on the bottom surfaces 403 of the first recesses 402, with the wavelength conversion members 60 and the first recesses 402 facing each other. The wavelength conversion members 60 and the covering member 40 are joined to each other via the second light-transmissive members 31 as in the method of manufacturing the light emitting device 3000 according to the third embodiment.

In mounting the wavelength conversion members 60 respectively on the bottom surfaces 403 of the first recesses 402, the second recesses 404 are respectively closed by the wavelength conversion members 60 and/or the second light-transmissive members 31, so that a gas portion is formed in each of the second recesses 404. By virtue of the second recesses 404 respectively having the outer edges disposed on an inner side of that of the wavelength conversion members 60 as seen in a plan view, the second recesses can be easily closed.

Operation D-5: Mounting Light Emitting Elements

The light emitting elements 10 are respectively disposed on the wavelength conversion members 60. The light emitting elements 10 and the wavelength conversion members 60 are respectively joined to each other via the first light-transmissive members 30.

In the case where the covering member including a plurality of lens portions is disposed on a mounting board such that the lens portions respectively straddle a plurality of light emitting elements mounted on the mounting board, individual positioning adjustment cannot be performed for misaligned ones of the light emitting elements. Therefore, misalignment occurs between the light emitting elements and the lens portions of the covering member. On the other hand, in the manufacturing method according to the present embodiment, the light emitting elements are respectively disposed on the corresponding lens portions of the covering member. Accordingly, the present embodiment can reduce a probability of misalignment in mounting light emitting elements on a mounting board. Thus, the present embodiment can realize a less probability of misalignment between the light emitting elements and the lens portions of the covering member.

Operation D-6: Forming Reflective Members

The reflective members 20 are respectively formed in the plurality of first recesses, in such a manner as to cover the periphery of each light emitting element while exposing the pair of electrodes 11, 12. The reflective members may be formed in the same or similar manner as the method of manufacturing the light emitting device 2000 according to the second embodiment.

Through the operations described above, the light emitting device 8000 according to the eighth embodiment can be obtained. Further, the operation of forming the conductive members may be included similarly to the method of manufacturing the light emitting device 2000 according to the second embodiment.

The light emitting device according to the embodiments of the present disclosure and the method of manufacturing the same are applicable to light sources for various types of applications such as lighting, various types of indicators, vehicular lighting, a display, a liquid crystal backlight, sensors, signals, vehicular components, and billboard channel letters.

What is claimed is:
1. A method of manufacturing a light emitting device comprising:
providing a light emitting element including a light extraction surface, an electrode-formed surface on a side opposite to the light extraction surface, lateral surfaces positioned between the light extraction surface and the electrode-formed surface, and a pair of electrodes on the electrode-formed surface;

providing a wavelength conversion member;

providing a covering member including a lens portion and a first recess on a side different from the lens portion;

disposing the wavelength conversion member on a bottom surface of the first recess, with the wavelength conversion member and the bottom surface of the first recess facing each other;

disposing the light emitting element on or above the wavelength conversion member; and forming a reflective member in the first recess to cover the lateral surfaces of the light emitting element while at least a part of the pair of electrodes is exposed from the reflective member.

2. The method of manufacturing a light emitting device according to claim 1, wherein the providing of the covering member includes providing the covering member that further include a second recess at the bottom surface of the first recess, the second recess being dimensioned so that an outer edge of the second recess is disposed on an inner side of an outer edge of the wavelength conversion member, as seen in a plan view, and the disposing of the wavelength conversion member includes covering an opening of the second recess on the bottom surface of the first recess with the wavelength conversion member.

3. The method of manufacturing a light emitting device according to claim 1, wherein the disposing of the light emitting element on or above the wavelength conversion member includes disposing the light emitting element above the wavelength conversion member with a first light-transmissive member being interposed between the light emitting element and the wavelength conversion member.

4. The method of manufacturing a light emitting device according to claim 1, wherein the disposing of the wavelength conversion member on the bottom surface of the first recess includes disposing the wavelength conversion member on the bottom surface of the first recess with a second light-transmissive member being interposed between the wavelength conversion member and the bottom surface of the first recess.

5. The method of manufacturing a light emitting device according to claim 2, further comprising forming a gas portion in the second recess between the light extraction surface of the light emitting element and the covering member.

6. The method of manufacturing a light emitting device according to claim 5, wherein the forming of the gas portion includes forming the gas portion so that an outer edge of the gas portion is disposed on an inner side of an outer edge of the light emitting element, as seen in the plan view.

7. The method of manufacturing a light emitting device according to claim 1, wherein the providing of the wavelength conversion member includes providing the wavelength conversion member including a light shielding portion disposed around a light-transmissive portion.

8. The method of manufacturing a light emitting device according to claim 7, further comprising forming a gas portion between the light extraction surface of the light emitting element and the covering member so that an outer edge of the gas portion is disposed on an outer side of the outer edge of the light-transmissive portion, as seen in a plan view.

9. The method of manufacturing a light emitting device according to claim 1, further comprising:

providing an additional light emitting element; and providing an additional wavelength conversion member, wherein the providing of the covering member includes providing the covering member further including an additional lens portion and an additional first recess on the side different from the lens portion, the additional lens portion being continuously and integrally formed with the lens portion, the disposing of the wavelength conversion member includes disposing the additional wavelength conversion member on a bottom surface of the additional first recess, with the additional wavelength conversion member and the bottom surface of the additional first recess facing each other, and the disposing of the light emitting element includes disposing the additional light emitting element on or above the additional wavelength conversion member.

10. The method of manufacturing a light emitting device according to claim 1, wherein the forming of the reflective member includes forming the reflective member so that at least the part of the pair of the electrodes is exposed outside the light emitting device.

11. The method of manufacturing a light emitting device according to claim 1, wherein the forming of the reflective member includes forming the reflective member so that the reflective member is in contact with at least a part of the light emitting element.

12. The method of manufacturing a light emitting device according to claim 11, wherein the forming of the reflective member includes forming the reflective member so that the reflective member is in contact with at least a part of the electrode-formed surface of the light emitting element.

13. The method of manufacturing a light emitting device according to claim 1, wherein the forming of the reflective member includes forming the reflective member so that the covering member is in contact with the reflective member.

14. The method of manufacturing a light emitting device according to claim 1, wherein the forming of the reflective member includes forming the reflective member so that a lower surface of the covering member is substantially flush with a lower surface of the reflective member.

15. The method of manufacturing a light emitting device according to claim 4, wherein the disposing of the wavelength conversion member on the bottom surface of the first recess includes disposing an outer edge of the second light-transmissive member on an outer side of an outer edge of lateral surfaces of the light emitting element, as seen in the plan view.

16. The method of manufacturing a light emitting device according to claim 3, wherein the disposing of the light emitting element on or above the wavelength conversion member includes disposing the first light-transmissive member to extend between the light extraction surface of the light emitting element and the wavelength conversion member.

17. The method of manufacturing a light emitting device according to claim 3, wherein the disposing of the wavelength conversion member on the bottom surface of the first recess includes disposing the wavelength conversion member on the bottom surface of the first recess with a second light-transmissive member being interposed between the wavelength conversion member and the bottom surface of the first recess with the outer edge of the second light-transmissive member being disposed on an outer side of an outer edge of the first light-transmissive member, as seen in the plan view.

18. The method of manufacturing a light emitting device according to claim 3, wherein the providing of the wavelength conversion member includes providing the wavelength conversion member including a light shielding portion disposed around a light-transmissive portion, and the disposing of the light emitting element on or above the wavelength conversion member includes disposing an outer edge of the first light-transmissive member on an outer side of an outer edge of the light-transmissive portion of the wavelength conversion member, as seen in the plan view.

19. The method of manufacturing a light emitting device according to claim 1, wherein the forming of the reflective member includes forming the reflective member so that an outer edge of the reflective member extends along a direction perpendicular to the light extraction surface of the light emitting element, in a cross-sectional view taken along a plane perpendicular to the light extraction surface of the light emitting element.

20. The method of manufacturing a light emitting device according to claim 1, wherein the forming of the reflective member includes forming the reflective member so that an outer edge of the reflective member extends along a direction parallel to the lateral surfaces of the light emitting element, in a cross-sectional view taken along a plane perpendicular to the light extraction surface of the light emitting element.

21. The method of manufacturing a light emitting device according to claim 4, wherein the disposing of the light emitting element on or above the wavelength conversion member includes disposing the light emitting element above the wavelength conversion member with a first light-transmissive member being interposed between the light emitting element and the wavelength conversion member and the first light-transmissive member being spaced apart from the second light-transmissive member.

22. The method of manufacturing a light emitting device according to claim 4, wherein the disposing of the wavelength conversion member on the bottom surface of the first recess includes disposing the second light-transmissive member to be in contact with a part of the covering member and a part of the wavelength conversion member.

* * * * *